United States Patent
Nakash

(10) Patent No.: US 7,511,935 B2
(45) Date of Patent: Mar. 31, 2009

(54) ELECTROSTATIC CHUCK AND METHOD OF ITS MANUFACTURE

(75) Inventor: Shmulik Nakash, Nes-Ziona (IL)

(73) Assignee: Applied Materials, Israel, Ltd., Rehovot (IL)

(*) Notice: Subject to any disclaimer, the term of this patent is extended or adjusted under 35 U.S.C. 154(b) by 208 days.

(21) Appl. No.: 11/363,965

(22) Filed: Feb. 27, 2006

(65) Prior Publication Data

US 2007/0201180 A1   Aug. 30, 2007

(51) Int. Cl.
*H01L 21/683* (2006.01)
(52) U.S. Cl. .................................................. 361/234
(58) Field of Classification Search ................ 361/234
See application file for complete search history.

(56) References Cited

U.S. PATENT DOCUMENTS

| | | | |
|---|---|---|---|
| 5,737,178 A | * | 4/1998 | Herchen ..................... 361/234 |
| 6,273,958 B2 | * | 8/2001 | Shamouilian et al. ....... 118/728 |
| 6,277,253 B1 | * | 8/2001 | Narasimhan et al. ... 204/298.06 |
| 6,908,860 B2 | * | 6/2005 | Katagiri et al. ............. 438/689 |

FOREIGN PATENT DOCUMENTS

WO   WO 2005/054540   *   6/2005

* cited by examiner

*Primary Examiner*—Michael J Sherry
*Assistant Examiner*—Luis Roman
(74) *Attorney, Agent, or Firm*—Tarek N. Fahmi

(57) ABSTRACT

An electrostatic chuck structure for holding an article is presented. The chuck structure comprises an electrically insulating chuck body layer having a first flat surface for holding the article thereon, and a second opposite surface having a honeycombed pattern in the form of an array of spaced-apart grooves. This second patterned surface of the chuck body surface for depositing thereon an electrically conductive layer (electrodes). A dielectric spacer between the electrodes and the article on the chuck body layer is defined by a portion of the chuck body layer between the grooves' bottom and the flat surface.

14 Claims, 4 Drawing Sheets

Top View

Bottom View

ELECTROSTATIC CHUCK AND METHOD OF ITS MANUFACTURE

RELATED APPLICATIONS

This application claims the priority benefit of U.S. Provisional Patent Application 60/656,324, filed 24 Feb. 2005, which is incorporated herein by reference.

FIELD OF THE INVENTION

This invention relates to an electrostatic chuck, particularly useful for holding semiconductor wafers.

BACKGROUND OF THE INVENTION

Chucks are used for holding substrates in process chambers, and are generally of three types: mechanical, vacuum, and electrostatic chucks. Electrostatic chuck is a mechanism for holding a substrate (wafer) using electrostatic attraction forces used in vacuum chambers. Through the generation of an electric field between wafer and supporting chuck, an attractive force is exerted on the wafer. The force is distributed homogenously over the surface, can be switched on/off and adjusted electrically. It ensures flat wafer adherence to the support as well as good thermal contact.

FIG. 1A illustrates the basic design of a conventional electrostatic chuck 10. It includes a three-layer structure formed by a chuck body. (or substrate) 12 made of a dielectric material (typically Ceramics), carrying an electrically conductive layer 14 containing an electrode arrangement defining one or two pairs of electrodes (not shown), and a top dielectric layer 16 (any dielectric material can be used, such as ceramics, plastics, etc, and even vacuum). Structure 10 closely resembles that of a parallel plate capacitor generating an electrostatic force that enables to flat silicon wafer structure W. Also, high acceleration motion systems can be used for wafer navigation. By applying a voltage between the two electrode plates, the wafer is attracted to the chuck. The generated electrostatic force is also affected by the thickness of dielectric film 16, the relative dielectric constant of the film material, as well as the chuck area. This is expressed by the following relation:

$$F = \frac{A \cdot \varepsilon_0 \cdot \varepsilon_R^2}{2} \cdot \left[\frac{V}{d}\right]^2 \quad (1)$$

wherein F is the chucking force [N], A is the effective chucking area [m$^2$]; $\varepsilon_0$ is 8.85e-12F/m—absolute permittivity of vacuum; $\varepsilon_R$ is the dielectric constant of the chosen material; V is the potential difference between the electrode and the substrate [Volts]; and d is the thickness of the upper dielectric layer.

FIG. 1B shows the typical process of manufacturing such a conventional chuck structure 10. The main structure (chuck body) 12 is prepared. Thin conductive layer 14 is deposited on top of structure 12. A planarization process (mechanical lapping) is applied to layer 14 to flat the top surface thereof. Then, thin dielectric layer 16 is deposited on top of conductive layer 14 and a further mechanical lapping is applied to layer 16 for lapping and polishing its top surface.

Conventional chucks can also be appropriately designed to support wafers of different diameters. To this end, the electrically conductive layer is appropriately patterned to define different electrode pairs.

SUMMARY OF THE INVENTION

There is a need in the art to facilitate the electrostatic chuck design and manufacture, so as to reduce the manufacturing costs and also to simplify the chuck construction, as well as its adjustment to different wafer sizes.

The main idea of the present invention consists in providing a novel electrostatic chuck which is made of two layers only. Thus chuck can be manufactured by three manufacturing steps.

This is implemented by providing a patterned chuck body layer, where the pattern is in the form of an array of spaced-apart grooves (which may for example be of a circular or oval cross section). Such a chuck body layer serves for carrying both the electrode arrangement on its patterned surface and an article (wafer) on its opposite flat surface. The patterned chuck body layer can be produced by conventional machining or CNC-based technique, as well as by molding/casting technique. An electrically conductive layer can be deposited onto the patterned surface of the chuck body layer (for example by thermal spraying to cover the inner surface of the grooves and spaces between the grooves within at least two spaced-apart continuous surface regions of the patterned surface to define at least one pair of electrodes. The other surface of the chuck body layer is made flat by applying lapping and polishing. Hence, according to the invention, the same chuck body layer is used for carrying the electrodes containing layer and the article under processing. The manufacture of such a chuck is simpler and cheaper than the convention technique.

There is thus provided according to one broad aspect of the invention, a chuck body structure for use in an electrostatic chuck for holding an article under processing, the chuck body structure comprising an electrically insulating layer having a first flat surface for holding the article thereon and a second opposite surface having a pattern in the form of an array of spaced-apart grooves for carrying an electrically conductive layer thereon.

According to another broad aspect of the invention, there is provided an electrostatic chuck structure for holding an article, the chuck structure comprising: an electrically insulating substrate layer having a first flat surface for holding the article thereon and a second opposite surface having a pattern in the form of an array of spaced-apart grooves; and an electrode arrangement containing layer within at least some of the spaced-apart grooves and the spaces between the grooves.

The substrate layer (chuck body layer) can be made of any sufficiently rigid dielectric material, for example ceramic alumina or any other type of ceramics, or plastic material.

It is typical in the semiconductor industry to configure the electrically conductive layer to match different article dimensions. To this end, as indicated above, in the chuck of the present invention, the electrically conductive layer may be formed by at least two spaced-apart continuous layer regions defining at least one pair, respectively, of the electrode arrangement. These two spaced-apart continuous layer regions are arranged to define an area corresponding to that of the article to be supported. Preferably, the electrically conductive layer is formed by four spaced-apart continuous layer regions defining two pairs, respectively, of the electrode arrangement. The electrodes of each pair are arranged to define an area corresponding to that of the article to be supported, different from that defined by the other pair of electrodes. Such a chuck structure can be designed for holding 200 mm and 300 mm wafers.

According to another broad aspect of the invention, there is provided a method of manufacturing an electrostatic chuck structure for holding an article, the method comprising producing a chuck body in the form of an electrically insulating substrate layer having a first flat surface for holding the article thereon and a second opposite surface having a pattern in the form of an array of spaced-apart grooves; thereby enabling deposition of an electrically conductive layer onto the second surface to define at least two spaced-apart electrodes, a portion of the electrically insulating substrate layer between the bottom of the grooves and said flat surface defining a dielectric spacer between the electrodes and the article held by the flat surface of the electrically insulating substrate layer.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF EXEMPLARY EMBODIMENTS

Figure 1A:
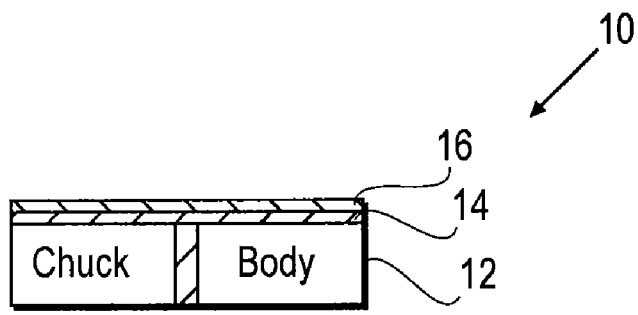
FIG. 1 is a schematic illustration of a convention electrostatic chuck structure.
Figure 1B:
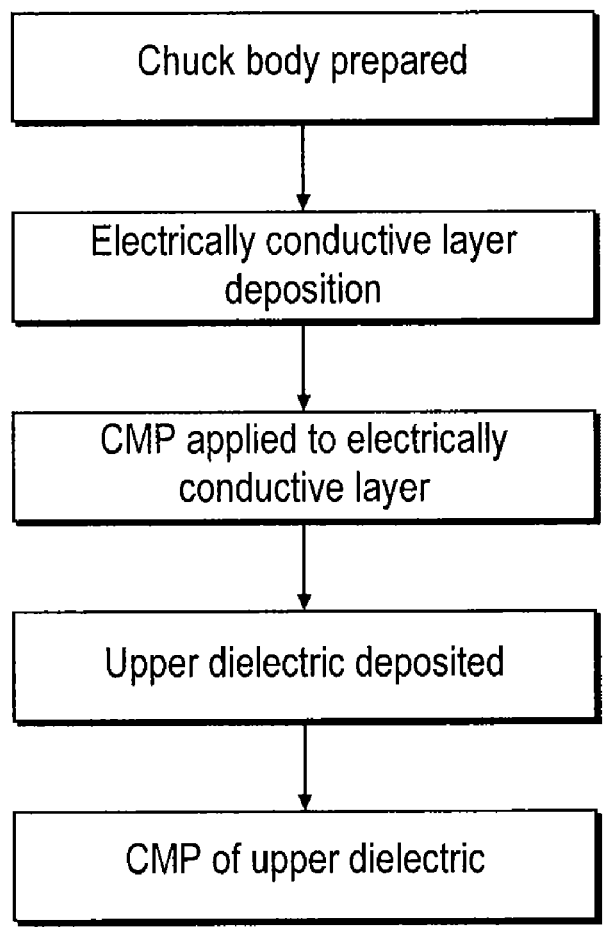

FIG. 1A illustrates the basic design of the conventional electrostatic chuck. Such a chuck is composed of three layers: an electrically conductive layer enclosed between a chuck body layer and an upper dielectric layer. As shown in FIG. 1B, the manufacture of this chuck requires two deposition processes and two planarization processes; making the manufacture process too complicated and expensive.

Chuck structure 100 is composed of two layer materials: an electrically insulating substrate or chuck body 12 carrying an electrically conductive layer 19 in which an electrode arrangement is formed (not shown here). According to the invention, substrate 12 is configured as the so-called "honeycomb structure", namely its surface 12A (constituting a second surface) is patterned to form an array of grooves, generally at 18A, arranged with spaces 18B between them, and its opposite surface 12B (constituting a first surface) is flat (polished) and serves for holding an article (e.g. wafer). Layer 19 is formed by an electrically conductive material located within the grooves and spaces between them.

It should be understood, although not shown in the figure, that layer 19 covers at least one pair of spaced-apart regions of surface 12A to form at least one pair of spaced-apart electrodes, and electrical contacts (pads) to electrodes are appropriately provided. More than one pair of electrodes can be formed to enable the same chuck to be used for supporting articles of different sizes (wafers of different diameters); each electrode pair defines a surface region corresponding to the respective article size. This aspect is known per se and therefore need not be specifically described, except to note that the invention provides for simplifying the electrodes creation as will be described further below.

It should be understood, although not shown in the figure, that layer 14 covers at least one pair of spaced-apart regions of surface 12A to form at least one pair of spaced-apart electrodes, and electrical contacts (pads) to electrodes are appropriately provided. More than one pair of electrodes can be formed to enable the same chuck to be used for supporting articles of different sizes (wafers of different diameters); each electrode pair defines a surface region corresponding to the respective article size. This aspect is known per se and therefore need not be specifically described, except to note that the invention provides for simplifying the electrodes creation as will be described further below.

Figure 2A:
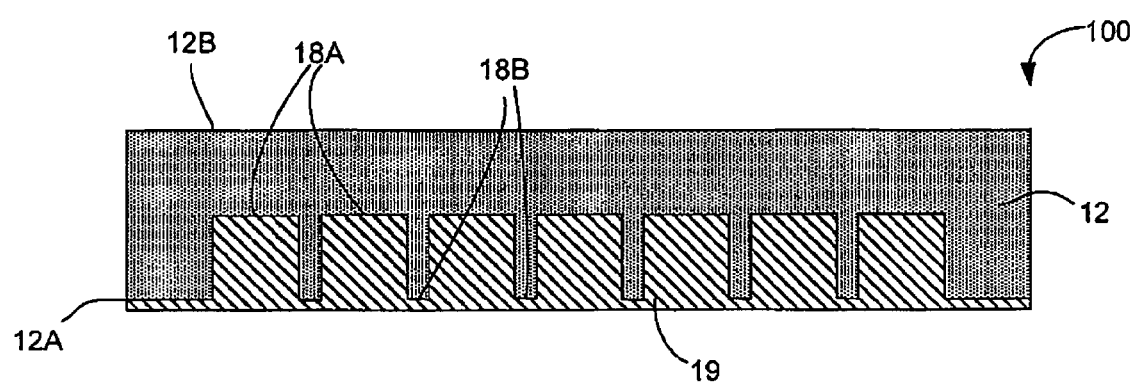
FIG. 2A illustrates a section view of an example of an electrostatic chuck structure according to the invention.
Figures 2B, 2C:
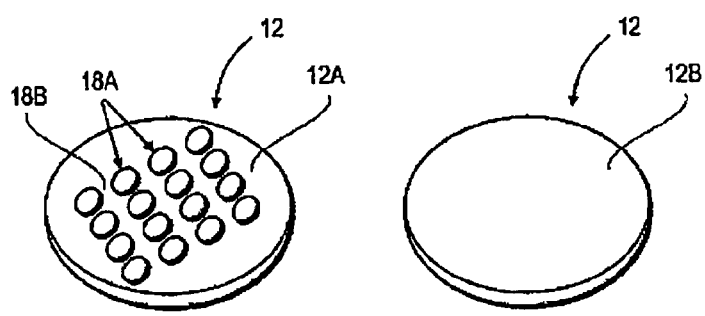
FIGS. 2B and 2C show the bottom and top views, respectively, of an example of a chuck body (substrate) according to the invention.

FIGS. 2B and 2C show more specifically the bottom and top views of patterned substrate structure 12 of the present invention. The first, top surface 12B of substrate 12 is made flat (polished) and thus serves for holding an article (not shown), while the second bottom surface is patterned. In the present example, the groove has a substantially circular cross section, but it should be understood that the invention is not limited to this specific example.

Preferably, the substrate 12 thickness and the groove 18A depth are selected to define a desired thickness of a dielectric spacer between the electrode (bottom of the groove) and the article (flat surface of the substrate). For example, the dielectric spacer thickness may be 100-300 microns; the groove depth may be 2-3 mm; the thickness of the electrode layer (e.g. aluminum powder thermal-sprayed at 700-800° C.) is about 100 microns. It should be understood that the rigidity of the entire structure might be even more increased by attaching the structure (its bottom, electrically conductive surface) to a solid body ceramics.

Figure 3B:
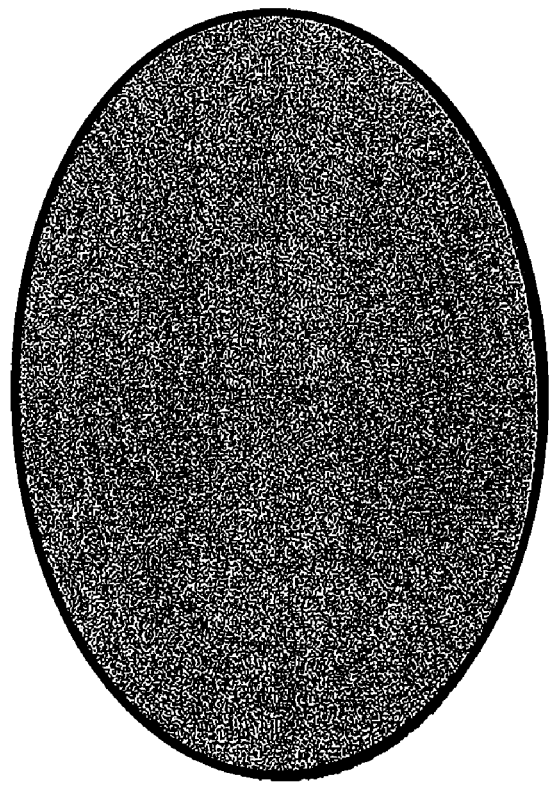
FIGS. 3A and 3B illustrate an examples of the chuck structure of the invention.
Figure 3A:
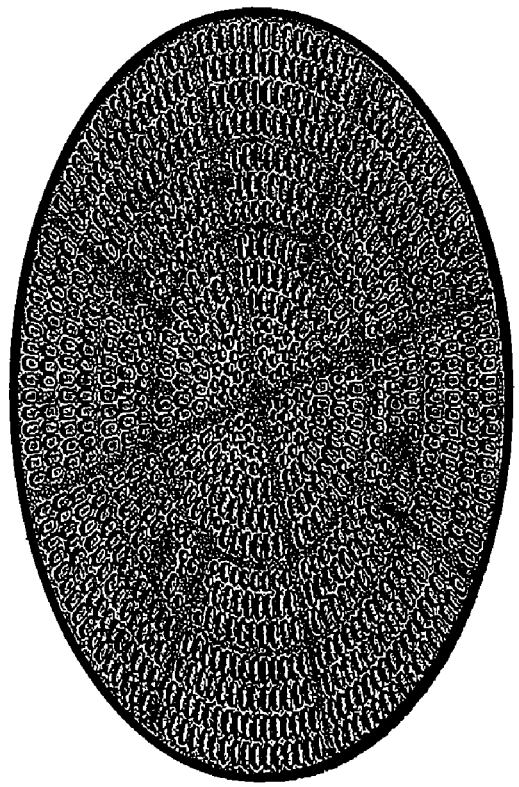

Reference is made to FIGS. 3A and 3B exemplifying the bottom and top view, respectively, of a honeycomb-like chuck body layer of the present invention, configured for supporting 200 mm and 300 mm diameter wafers.

Thus, according to the invention, the chuck body of the conventional electrostatic chuck structure and its upper dielectric layer are combined to form a single structural body. In other words, the chuck body and the dielectric layer support are constituted by the same electically insulating layer (the same material). The conductive layer on the bottom surface of the chuck body layer is formed by electrically conductive regions inside the grooves and in between. Chuck structure 100 can thus be made lighter than the conventional one by about 30% or more.

Figure 4:
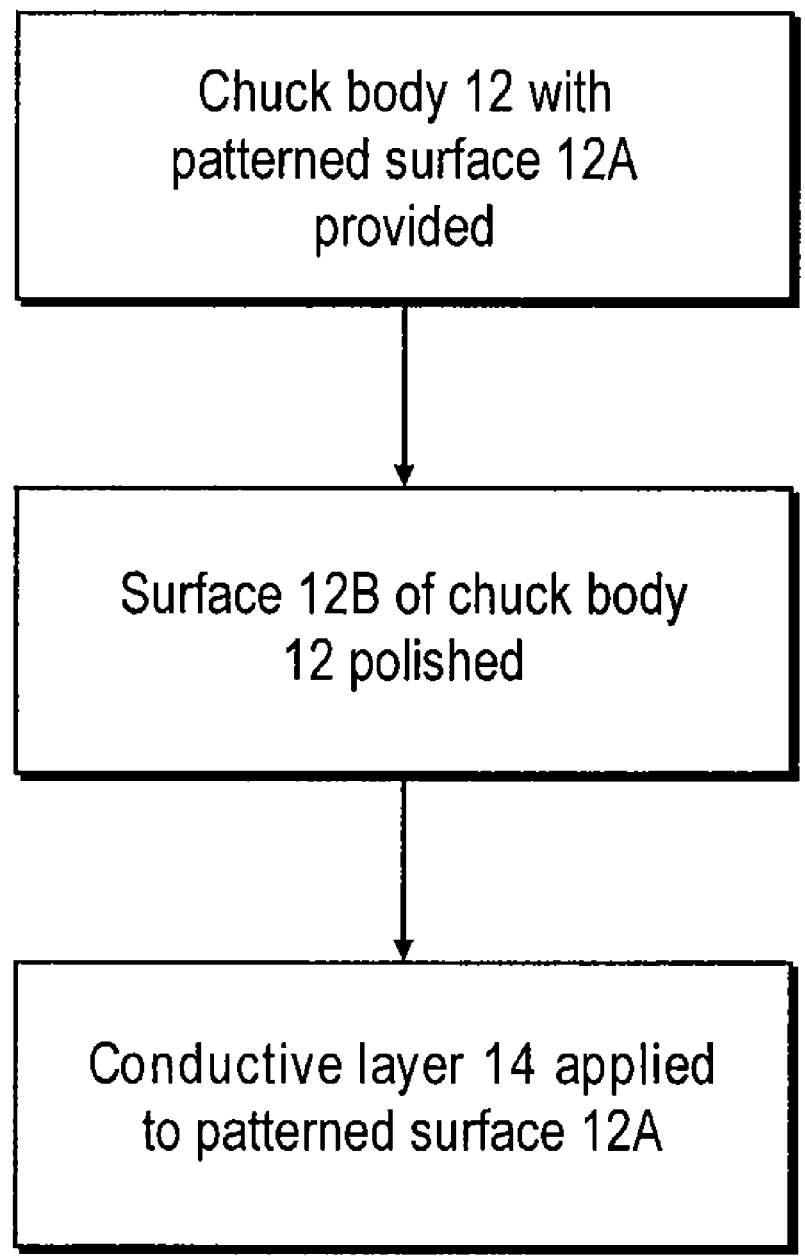
FIG. 4 is a flow diagram of the main steps in a method according to the invention for manufacturing the electrostatic chuck structure.

The honeycomb-like chuck structure of the present invention can be manufactured by only three steps. This is shown in FIG. 4. Patterned chuck body structure 12 is prepared, e.g. using a simple machining technique. Lapping and polishing is applied to its upper surface 12B. Thin conductive layer 19 is applied on the patterned surface 12A (e.g. by thermal spraying of aluminum powder). Preferably, the lapping and polishing is applied prior to depositing the conductive layer.

This manufacturing process is simpler and cheaper than the conventional one. The chuck structure has a lower weight, while being sufficiently rigid. Applying lapping and polishing as the first manufacturing step results in the high flatness and roughness performances. Therefore, heat generated during the lapping process will not affect the conductive layer or main body. It should also be noted that in case lapping and polishing of the upper flat surface is applied after the deposition of the electrically conductive layer onto the opposite surface, the heat generation will still not affect the conductive layer, since it could expand into the free space of the groove. The manufacturing process does not provide any potential de-lamination of the dielectric layer from the conductive layer. The invention is not limited to any specific dielectric material. As indicated above, the conductive layer may be applied so as to define more than one pair of electrodes to enable the same chuck to be used for supporting articles of different sizes, e.g. 200 mm and 300 mm wafers. The method of the present invention makes this technique simpler, as well. It should also be noted that the technique of the invention provides for no glue or air between the dielectric layer and the conductive layer.

The technique of the present invention provides for obtaining a required chucking force. This is associated with the following:

The loss of the chucking force due to the reduction of the effective chucking area (depending on the grooves array character) can be compensated for by choosing high dielectric constant materials, reduce the thin dielectric layer "walls" or increasing the chucking voltage, as shown by the above equation (1) for the chucking force F. It should be noted, that considering the chuck structure of the invention, parameter d in eq. (1) is the thickness of the dielectric spacer between the bottom of the groove and the flat top surface of the chuck body layer.

The following is the calculation of a chucking force for an exemplary honeycomb-like chuck structure with the electrodes arrangement configured for 300 mm wafer. In this example, Ceramic Alumina of 99.8% purity and dielectric constant of 10 is considered as the chuck body material; a dielectric layer thickness is 200 microns; a honeycomb array includes 1500 grooves, each of a 3 mm diameter, with the total chucking area of 0.029 m$^2$; and chucking voltage of 800V.

$$F = \frac{A \cdot \varepsilon_0 \cdot \varepsilon_R^2}{2} \cdot \left[\frac{V}{\lambda}\right]^2, \text{ thus being}$$

$$F = \frac{0.029 \cdot \varepsilon_0 \cdot 10^2}{2} \cdot \left[\frac{800}{0.0002}\right]^2 = 208[N]$$

or approximately 3000 Pascal chucking pressure on a 300 mm wafer.

Thus, the present invention provides for a novel electrostatic chuck which has a simpler and cheaper configuration as the conventional chucks of the kind specified, while providing for generation of the required chucking force.

Those skilled in the art will readily appreciate that various modifications and changes can be applied to the embodiments of the invention as hereinbefore exemplified without departing form its force defined in and by the appended claims.

The invention claimed is:

1. A chuck body structure for use in an electrostatic chuck structure for holding an article, the chuck body structure comprising:
    an electrically insulating substrate layer having a first flat surface for holding the article thereon and the insulating substrate layer having a second opposite surface patterned in the form of an array of spaced-apart grooves; and,
    an electrode arrangement comprising at least one substantially continuous electrically conductive layer deposited onto said second opposite surface, each said conductive layer covering at least some of the spaced-apart grooves and at least some of the spaces between the grooves.

2. The chuck body structure of claim 1, wherein said substrate layer is made of at least one ceramic materials.

3. The chuck body structure of claim 1, wherein the configuration of the patterned substrate layer defines an insulator spacer between the electrode arrangement and the article being held by said flat surface.

4. The chuck body structure of claim 3, wherein a thickness of said insulator spacer is about 100-300 microns.

5. The chuck body structure of claim 1, wherein the grooves have a depth of about 2-3 mm.

6. The chuck body structure of claim 1, wherein the electrode arrangement comprises at least two spaced-apart electrically conductive regions defining at least one pair of spaced-apart electrodes.

7. The chuck structure of claim 6, wherein said electrically conductive layer is made of Aluminum or Titanium.

8. The chuck structure of claim 6, wherein said two spaced-apart electrically conductive regions are arranged to define an area corresponding to that of the article to be supported.

9. The chuck structure of claim 6, wherein the electrode arrangement comprises at least four spaced-apart regions defining at least two pairs, respectively, of said electrode arrangement.

10. The chuck structure of claim 9, wherein the spaced apart regions associated with a first pair of electrodes are arranged to define a first area corresponding to that of the article to be supported, said first area being different from a second area defined by the spaced apart regions associated with a second pair of electrodes.

11. A method of manufacturing an electrostatic chuck structure for holding an article, the method comprising
    producing a chuck body in the form of an electrically insulating substrate layer having a first flat surface for holding the article thereon and the insulating layer having a second opposite surface patterned in the form of an array of spaced-apart grooves; and
    forming an electrode arrangement on said second opposite surface by depositing a substantially continuous electrically conductive layer onto said second opposite surface, said conductive layer covering at least some of the spaced-apart grooves and at least some of the spaces between the grooves, and wherein the configuration of the electrically insulating substrate layer defines a dielectric spacer between the electrode arrangement and the article held by the flat surface of the electrically insulating substrate layer.

12. The method of claim 11, wherein said patterned substrate is produced by applying a machining technique to a substrate material plate.

13. The method of claim 12, comprising depositing an electrically conductive layer on the patterned surface of the chuck body so as to form at least two spaced-apart electrically conductive regions for at least two electrodes, respectively.

14. The method of claim 13, wherein said depositing of the electrically conductive layer is carried out by thermal spraying.

* * * * *